United States Patent
Casagrande et al.

(10) Patent No.: US 12,132,510 B2
(45) Date of Patent: Oct. 29, 2024

(54) METHOD FOR DETECTING AN RF SIGNAL IN A SUPER-REGENERATIVE RECEIVER, AND RECEIVER FOR IMPLEMENTING THE METHOD

(71) Applicant: The Swatch Group Research and Development Ltd, Marin (CH)

(72) Inventors: Arnaud Casagrande, Bôle (CH); Jean-Luc Arend, Corcelles (CH)

(73) Assignee: The Swatch Group Research and Development Ltd, Marin (CH)

( * ) Notice: Subject to any disclaimer, the term of this patent is extended or adjusted under 35 U.S.C. 154(b) by 357 days.

(21) Appl. No.: 17/841,131

(22) Filed: Jun. 15, 2022

(65) Prior Publication Data

US 2023/0102272 A1   Mar. 30, 2023

(30) Foreign Application Priority Data

Sep. 30, 2021   (EP) ..................................... 21200071

(51) Int. Cl.
*H04W 48/18*   (2009.01)
*H04B 1/18*   (2006.01)
(Continued)

(52) U.S. Cl.
CPC ................. *H04B 1/26* (2013.01); *H04B 1/18* (2013.01)

(58) Field of Classification Search
CPC ..................................... H04B 1/26; H04B 1/18
See application file for complete search history.

(56) References Cited

U.S. PATENT DOCUMENTS

| | | |
|---|---|---|
| 2004/0198288 A1 | 10/2004 | Sadowski |
| 2004/0212444 A1 | 10/2004 | Peng |
| | (Continued) | |

FOREIGN PATENT DOCUMENTS

| | | |
|---|---|---|
| GB | 2 433 365 A | 6/2007 |
| JP | 8-84025 A | 3/1996 |
| | (Continued) | |

OTHER PUBLICATIONS

European Search Report No. 21 20 0071 dated Mar. 11, 2022.
(Continued)

*Primary Examiner* — Moustapha Diaby
(74) *Attorney, Agent, or Firm* — Sughrue Mion, PLLC

(57) ABSTRACT

A method for detecting an RF signal detected by a super-regenerative receiver (1). The receiver includes a reference oscillator (4) for generating an oscillation in the oscillator, a bias current generator (7) for supplying a bias current, an oscillation detector (6) connected between an output (coilp) of the oscillator and the bias current generator for controlling when an RF signal is received by the receiver, and an impedance matching unit (3) disposed between the input of the receiver and the reference oscillator (4). Following activation of a start control signal, detection of the oscillation of the reference oscillator is performed, and once the reference oscillator oscillates above a critical increasing bias current value, the oscillation detector orders the bias current generator to cut off the bias current and thus stop the oscillation of the reference oscillator to reduce the overall electricity consumption during an RF signal detection phase.

8 Claims, 2 Drawing Sheets

(51) Int. Cl.
 *H04B 1/26* (2006.01)
 *H04W 88/06* (2009.01)

(56) References Cited

U.S. PATENT DOCUMENTS

| | | | |
|---|---|---|---|
| 2006/0264196 A1* | 11/2006 | Fan | H04B 1/24 455/334 |
| 2007/0075787 A1* | 4/2007 | Jensen | H03L 7/093 331/17 |
| 2007/0139130 A1* | 6/2007 | Kim | H03D 11/06 331/185 |
| 2018/0309406 A1* | 10/2018 | Yun | H03B 5/1265 |
| 2019/0363703 A1* | 11/2019 | Casagrande | H03K 5/04 |

FOREIGN PATENT DOCUMENTS

| | | |
|---|---|---|
| JP | 2011-503950 A | 1/2011 |
| WO | 2009/056889 A2 | 5/2009 |

OTHER PUBLICATIONS

Alexandre Vouilloz et al., "A Low-Power CMOS Super-Regenerative Receiver at 1 GHz", IEEE Journal of Solid-State Circuits, Mar. 3, 2001, vol. 36, No. 3, p. 440-451.

\* cited by examiner

METHOD FOR DETECTING AN RF SIGNAL IN A SUPER-REGENERATIVE RECEIVER, AND RECEIVER FOR IMPLEMENTING THE METHOD

CROSS REFERENCE TO RELATED APPLICATION

This application claims priority to European Patent Application No. 2120007.5, filed on Sep. 30, 2021 the entire contents of which are incorporated herein by reference.

TECHNICAL FIELD OF THE INVENTION

The invention relates to a method for detecting an RF signal in a super-regenerative receiver with a view to reduce electricity consumption, as well as the receiver for implementing the method.

PRIOR ART

Since the 1920s, a short-wave receiver invented by Edwin Howard Armstrong has been known, which also initially comprises three lamps, which are expensive, and its invention made it possible to reduce the operation of the receiver to one lamp. As discussed hereinafter, this principle is used by the present invention of the super-regenerative receiver to reduce the electricity consumption and simplify the architecture of said receiver.

U.S. Pat. No. 5,613,231 A describes an oscillator equipped with an active component or amplifier and a reactive stabilisation component. The active component is a bipolar transistor disposed in a common base circuit, while the reactive component is a dielectric resonator entirely coupled with the transistor collector. The base of the bipolar transistor is connected to a pole of a power supply via a first resistor and to a common point via a second resistor and of which the transmitter is connected to the same pole via a third resistor. A resonator core is connected between the collector of the bipolar transistor and the common point. Nothing is described as to how to detect an RF signal rapidly and with a view to reduce electricity consumption.

SUMMARY OF THE INVENTION

Therefore, the aim of the invention is that of providing a method for detecting an RF signal in a super-regenerative receiver by overcoming the drawbacks mentioned above of the prior art so as to reduce the electricity consumption by rapidly detecting an RF signal at the receiver input. Furthermore, the receiver is capable of implementing the method for detecting an RF signal.

To this end, the invention relates to a method for detecting an RF signal in a super-regenerative receiver, which comprises the features defined in independent claim 1.

Specific steps of the method are defined in dependent claims 2 to 5.

An advantage of the method for detecting an RF signal in a super-regenerative receiver lies in that it makes it possible to rapidly detect an RF signal at the receiver input while reducing the electricity consumption as much as possible by only momentarily leaving the oscillation of the reference oscillator defined as VCO for the detection and stopping it once the RF signal has been detected. According to the present invention, it is recommended to stop the oscillation of the VCO immediately once a detection of the RF signal has been determined. Thus, once the oscillation appears or is detected in the VCO oscillator, the oscillation is immediately stopped to reduce the electricity consumption. To do this, the mean bias current of the VCO oscillator, which is preferably an LC oscillator composed essentially of an inductance and a capacitor in parallel, must be at the critical current value.

Advantageously, the external RF signal, which is collected by the receiver antenna, is carried directly on the resonant circuit of the oscillator, thus creating an initial oscillation condition more or less favourable for the more or less rapid starting of the oscillator.

To this end, the invention relates to a super-regenerative receiver for implementing the method, which comprises the features defined in independent claim 6.

Specific embodiments of the receiver are defined in dependent claims 7 and 8.

BRIEF DESCRIPTION OF THE FIGURES

The aims, advantages and features of the method for detecting an RF signal in a super-regenerative receiver will emerge more clearly in the following description based on non-limiting embodiments and illustrated by the drawings wherein.

DETAILED DESCRIPTION OF THE INVENTION

In the following description, reference is made to a method for detecting an RF radiofrequency signal in a super-regenerative receiver with a view to reduce the electricity consumption for performing these operations. Obviously all the components used in the receiver, which are well-known in the technical field, will only be described in a simplified manner. Reference is essentially made to the detection of the RF signal at the output of the reference oscillator which can be a VCO oscillator for example of LC type.

Figure 1:
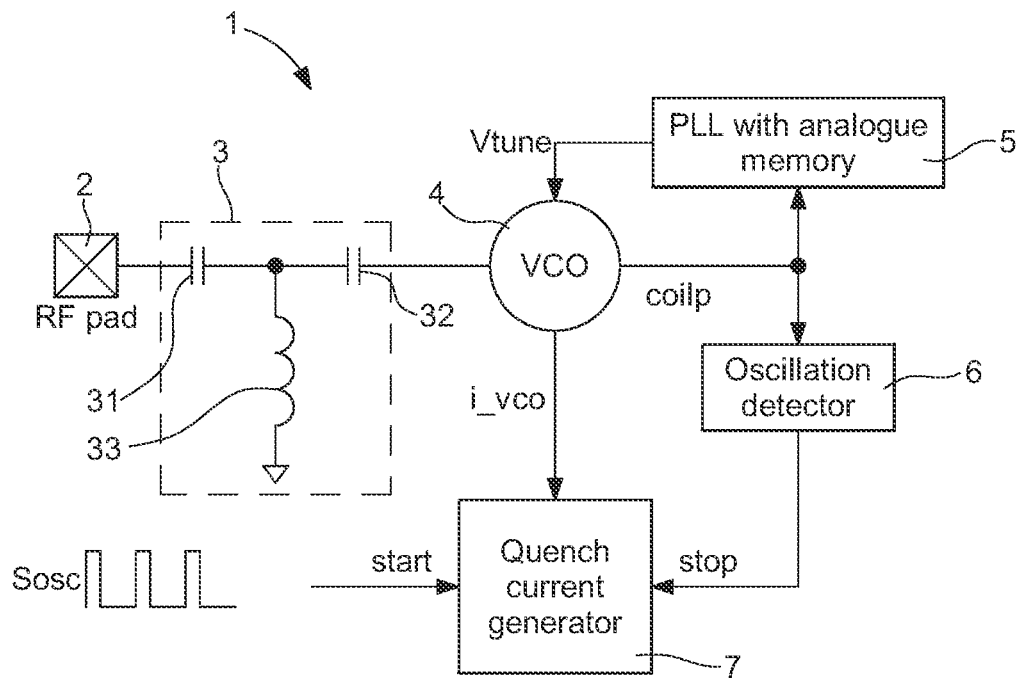
FIG. 1 represents, in a simplified manner, a first embodiment of a super-regenerative receiver with a set of electronic components for detecting the presence of an RF signal at the input and with a reduction in electricity consumption according to the present invention.

FIG. 1 represents in a more comprehensive manner a first embodiment of an RF signal receiver 1 capable of detecting the reception of at least one RF signal. For this, the receiver 1 firstly comprises an input terminal or pad 2 for receiving an RF signal. The receiver 1 comprises a reference oscillator 4 for generating an oscillation in the oscillator, a bias current generator 7 for supplying a bias current i_vco to the reference oscillator 4. The bias current i_vco is supplied to the reference oscillator 4 particularly after receiving at least one activation or start control signal start for example of a cycle of control signals Sosc for the bias current generator 7. The super-regenerative receiver 1 further comprises an oscillation detector 6, which is connected between an output coilp of the reference oscillator 4 and the bias current generator 7 so as to control the generator 7 after an RF signal is received by the receiver 1. An impedance matching unit 3 of the receiver 1 is disposed between the receiving terminal or pad 2 of the receiver 1 and the reference oscillator 4.

In the cycle of control signals Sosc, there is firstly a first control signal start for supplying a polarisation command of the reference oscillator 4. From this time, following the activation control signal start of the bias current generator 7, the bias current increases for example linearly until a critical value of the bias current is obtained from which the reference oscillator 4 can start oscillating for example at a high frequency of the order of 2.4 GHz. From this oscillation time of the reference oscillator 4, a detection is performed in the oscillation detector 6 so as to supply a stop signal stop to the bias current generator 7 to immediately stop the oscillation of the reference oscillator 4. This is the aim sought by the present invention, of thus completely stopping the supply of the bias current supplied to the reference oscillator 4 once the oscillation of the reference oscillator 4 has been detected. A reduction in electricity consumption is thus obtained by immediately stopping the supply of the bias current i_vco to the oscillator 4 once the critical bias current value has been attained. The oscillator immediately stops oscillating after the stop command stop supplied by the oscillation detector 6 to the bias current generator 7.

Preferably, the reference oscillator 4 is an LC type VCO voltage-controlled oscillator, which comprises in parallel at least one inductance L1 and one capacitor C1. In the configuration shown in FIG. 1, the inductance L1 is separated into two inductances connected to one another and of which the connection of the two inductance parts is powered by a tuning voltage Vtune. For this, the receiver 1 further comprises a PLL phase lock loop 5 connected between the output coilp of the VCO oscillator 4 and a variable-capacitance device connected in parallel of the oscillating circuit composed of L1. The tuning voltage Vtune at the output of the PLL loop 5 is a control voltage of the oscillation frequency of the VCO voltage-controlled oscillator 4. The PLL loop 5 can comprise an analogue memory to record the control voltage Vtune. Obviously, as the oscillator acts in differential mode, the output terminal coiln not shown can also be used instead of the output terminal coilp of the reference oscillator 4. In this scenario, the terminal coiln is the input of the reference oscillator 4 connected by the impedance matching unit 3 to the terminal or pad 2 of the RF signal receiver 1.

As represented in FIG. 1, the impedance matching unit 3 is used to tune the RF radiofrequency signal received by the receiver 1 before entering the reference oscillator 4 which is preferably a VCO oscillator. This impedance matching unit 3 first comprises a first capacitor 31 connected, on one hand, to the input terminal or pad 2 of the RF signal and, on the other hand, connected to a second capacitor 32 the other end of which is connected to the input of the reference oscillator 4 which is the VCO oscillator. The impedance matching unit 3 further comprises an inductance 33, which is on one hand connected to the connection of the two capacitors 31, 32 and on the other hand to the ground.

Obviously for the super-regenerative receiver 1, a unit for processing all the signals, which can comprise a processor timed by another oscillator or a microprocessor, must be provided in the receiver. Control signals of the different electronic components of the receiver can be transmitted by the processing unit not shown. The processing unit can account for the reception of a first RF signal to order the activation of the bias current generator. The processing unit can also be used for the supply of at least one activation control signal Sosc to activate the bias current generator 7 once a measurement of the RF activity is ordered.

Figure 4:
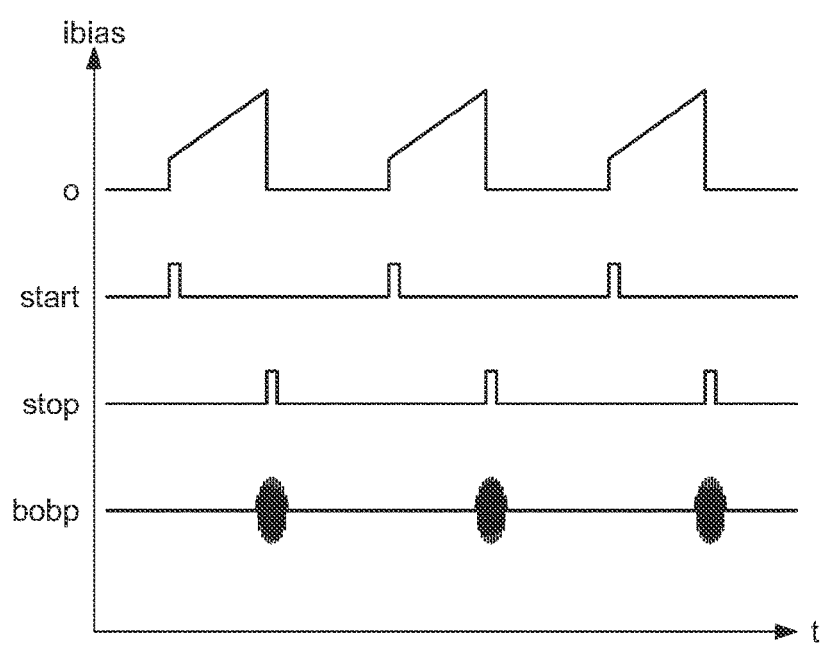
FIG. 4 represents activation signals of the receiver and essentially of the VCO oscillator, essentially representing the start signals for activating the oscillation, the bias signals, the stop signals following the detection of oscillation above a critical threshold, and the cut-off of oscillation from its detection defining the presence of an RF signal at the receiver input according to the present invention.

To be able to describe the method for detecting an RF signal at the input of the receiver 1, reference is also made to FIG. 4 representing the different signals for the RF signal reception detection operation. It is also specified that the super-regenerative receiver 1 is preferably a wake-up receiver, which must be continually operating but with very short periods over time as defined in the cycle of the control signals Sosc, which are several successive start control signals start supplied over time to the bias current generator 7. In the case of a VCO oscillator which is of the LC type, it is the oscillator, which is provided to be frequently in a triggered state and which is arranged to start very frequently over short periods and very rapidly at high-frequency operation for example at 2.4 GHz. The VCO oscillator can be engaged rapidly over short periods to react with few components on key elements of the oscillation which must be started rapidly. The start control signal start or the oscillation may start over a period of 1 µs and over one second, there may be approximately 1000 start or engagement control periods start of the VCO oscillator 4. This means that the receiver 1 is only fully engaged for 1 ms out of one second, which reduces the electricity consumption substantially and which is sought. As explained above following a first start control signal start supplied to the bias current generator 7, a linear growth of the bias current value occurs until a critical bias current value is attained. Once the critical value current is attained, the VCO reference oscillator 4 starts oscillating, which is detected directly by the oscillation detector 6 which sends an oscillation stop control signal stop to the bias current generator 7. The oscillation of the VCO reference oscillator is cancelled. The information in respect of the RF signal detected is present in the start time only. This time being established by the start of oscillation, it is therefore possible to then switch the oscillator off completely, which enables a significant reduction in electricity consumption of the receiver 1 with respect to that known in the prior art.

Obviously, the frequency of occurrence of these start control signals Sosc start for the bias current generator 7, can be modified manually or automatically to adapt to the conditions of the reference oscillator 4.

It should furthermore be noted that in an initial frequency centring mode, the VCO oscillator is started in a PLL type loop in order to determine the voltage Vtune corresponding to the reception frequency particularly in a conventional frequency synthesiser. Then, the voltage is saved in memory by a DAC and the synthesiser is deactivated. The VCO oscillator 4 is switched off and the RF signal can be sent on the output of the VCO oscillator 4 in order to perform demodulation by super-regeneration (measurement of the VCO start time in the presence of a ramp of the bias current thereof). Thus, it is possible not to lower the frequency for the demodulation in this super-regenerative receiver.

Such a frequency synthesiser, which comprises the VCO oscillator, was described in the patent application EP 3 573 241 A1 with reference to FIG. 4 in the description. If such a frequency synthesiser is used for centring frequencies of the VCO oscillator of the present invention, this patent application is incorporated here by reference.

The super-regenerative receiver will now be described further with reference to FIGS. 2 and 3 of other embodiments.

Figure 2:
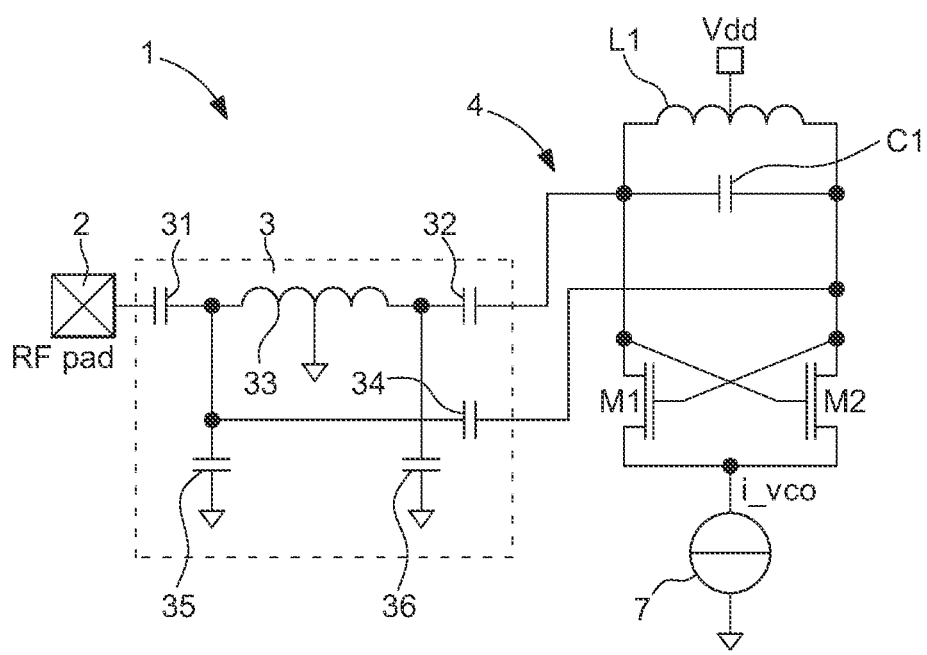
FIG. 2 represents a second simplified embodiment of the RF signal receiver with an impedance matching unit and a reference oscillator, such as a voltage-tuned VCO with a bias current for generating an oscillation of the oscillator according to the present invention.

FIG. 2 represents a second embodiment of the receiver only showing the input 2 of the receiver, the impedance matching unit 3 and the reference oscillator 4 which is here a VCO oscillator 4. In this FIG. 2, the oscillation detector and the PLL phase lock loop are not shown, but as above, they act at the same point of the receiver. The VCO oscillator is composed of a first inductance L1 and a capacitor C1 connected in parallel to the inductance L1. As above, the inductance L1 is separated into two inductances connected to one another and of which the connection of the two inductance parts is powered by a power supply voltage Vdd. The VCO oscillator 4 furthermore comprises at the bottom at a first connection end of the inductance L1 and the capacitor C1, a first transistor M1, which is preferably a MOS transistor, for example in this configuration an NMOS transistor, and at a second connection end of the inductance L1 and the capacitor C1, a second transistor M2 of the same type as the first transistor, for example an NMOS transistor. The drain terminal of the first transistor M1 is connected to the first connection end of the inductance L1 and the capacitor C1, while the drain terminal of the second transistor M2 is connected to the second connection end of the inductance L1 and the capacitor C1. The gate of the first transistor M1 is connected to the drain of the second transistor M2, while the gate of the second transistor M2 is connected to the drain of the first transistor M1. The two sources of the two transistors M1 and M2 are connected to receive the bias current from the bias current generator 7. The output coilp of the VCO oscillator can be supplied by the drain of the second transistor M2.

The impedance matching unit 3 comprises a first capacitor 31 connected on a first side to the input terminal or pad 2 of the receiver 1, while a second side of the first capacitor 31 is connected to a first end of an additional inductance 33, of which a second end of the additional inductance is connected to a first side of a second capacitor 32. The additional inductance 33 is separated into two inductances connected to one another and of which the connection of the two inductance parts can be connected to the ground. The connection of the first capacitor 31 and the additional inductance 33 is furthermore connected to a first side of a third capacitor 34 and to a first side of a fourth capacitor 35 of which the second side is connected to the ground. A first side of a fifth capacitor 36 is connected to the connection of the second capacitor 32 and the additional inductance 33. The second side of the fifth capacitor 36 is connected to the ground.

A second side of the second capacitor 32 is connected to the first end of the inductance L1 and the capacitor C1 and also to the gate of the second transistor M2 and to the drain of the first transistor M1. A second side of the third capacitor 34 is connected to the second end of the inductance L1 and the capacitor C1 and also to the gate of the first transistor M1 and to the drain of the second transistor M2. The frequency tuning voltage is applied to a variable capacitance varicap connected in parallel with the inductance L1.

Figure 3:
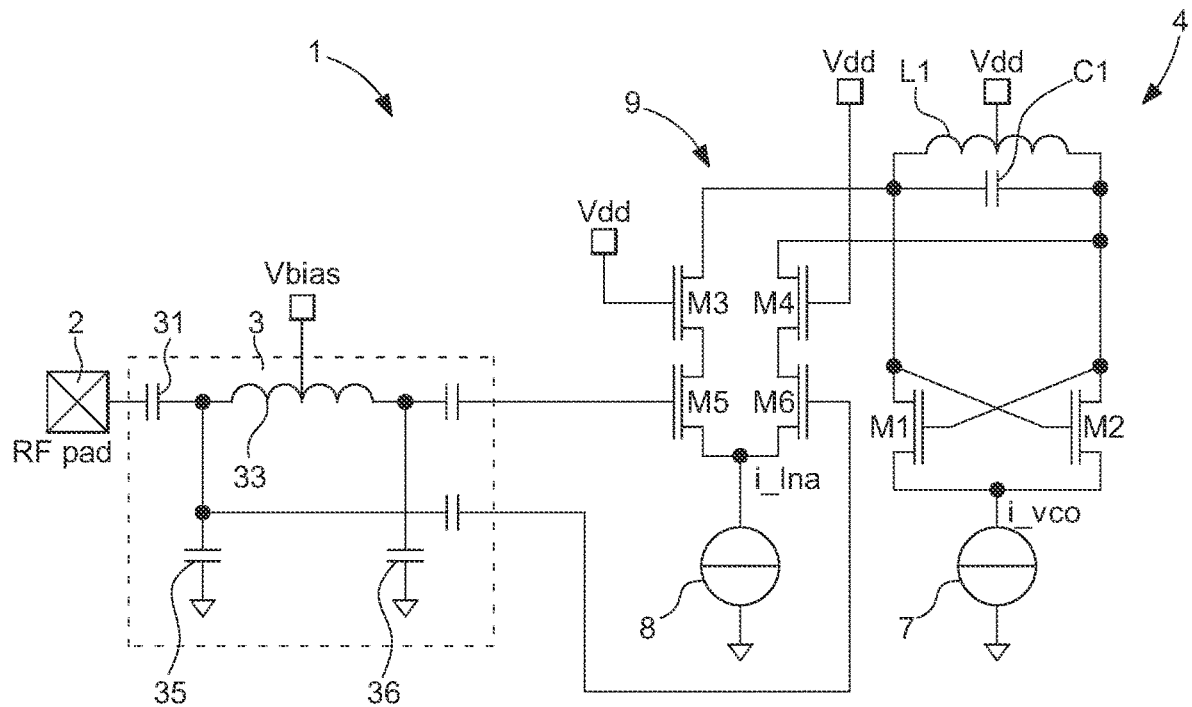
FIG. 3 represents a third simplified embodiment of the RF signal receiver with an impedance matching unit connected to a preamplifier supplying pre-amplified signals to the VCO reference oscillator and with bias currents for the VCO.

FIG. 3 represents a third embodiment of the receiver 1 only showing the input 2 of the receiver, the impedance matching unit 3, the reference oscillator 4 which is here a VCO oscillator 4, and a pre-amplifier 9 disposed between the impedance matching unit 3 and the VCO oscillator 4. This pre-amplifier 9 is supplied with current i_Ina by a current source 8, which can be part of the bias current generator or be independent of this generator. In this FIG. 3, the oscillation detector and the PLL phase lock loop are not shown, but as above, they act at the same point of the receiver. The VCO oscillator 4 comprises exactly the same elements or components already described with reference to FIG. 2. For this reason, they will not be repeated here to ascertain the connections thereof with one another. The first inductance L1 and a capacitor C1 are connected in parallel.

The impedance matching unit 3 comprises a first capacitor 31 connected on a first side to the input terminal or pad 2 of the receiver 1, while a second side of the first capacitor 31 is connected to a first end of an additional inductance 33, a second end of the additional inductance 33 is connected to an input of the pre-amplifier 9. The additional inductance 33 is separated into two inductances connected to one another and of which the connection of the two inductance parts can be connected to a bias voltage Vbias. The connection of the first capacitor 31 and the additional inductance 33 is furthermore connected to a second input of the pre-amplifier 9 and to a first side of a fourth capacitor 35 of which the second side is connected to the ground. A first side of a fifth capacitor 36 is connected to a second end of the additional inductance 33. The second side of the fifth capacitor 36 is connected to the ground.

The pre-amplifier 9 is composed of two pairs of NMOS transistors disposed on top of one another. The first pair of NMOS transistors M5, M6 have their sources connected to receive a current i_Ina from a current source 8 which can also be part of the bias current generator. The gate of the first transistor M5 of the first pair is connected to the second end of the additional inductance 33 and to the first side of the fifth capacitor 36. The gate of the second transistor M6 of the first pair is connected to the second end of the additional inductance 33 and to the first side of the fourth capacitor 35. The drain of the first transistor M5 of the first pair is connected to the source of the first transistor M3 of the second pair, while the drain of the second transistor M6 of the first pair is connected to the source of the second transistor M4 of the second pair. The gates of the first and second transistors M3 and M4 of the second pair are connected to a power supply voltage terminal Vdd. The drain of the first transistor M3 of the second pair is connected to the first connection end of the inductance L1 and the capacitor C1. Finally, the drain of the second transistor M4 of the second pair is connected to the second connection end of the inductance L1 and the capacitor C1. The bias current supplied by the pre-amplifier 9 makes it possible to reduce the growth time of the bias current of the bias current generator 7. Under these conditions, the critical current limit value arrives much more quickly, which reduces the receiver engagement time further.

As stated above, a reference oscillator 4 other than a conventional VCO oscillator can be used provided that it can operate at high frequency for example around 2.4 GHz.

Based on the description above, several alternative embodiments of the method for detecting an RF signal in a super-regenerative receiver can be devised without leaving the scope defined by the claims.

What is claimed is:

1. A method for detecting an RF signal detected by a reception terminal or pad (2) of a super-regenerative receiver (1), the receiver (1) comprising a reference oscillator (4) for generating an oscillation in the oscillator, a bias current generator (7) for the reference oscillator (4) for supplying a bias current on receiving an oscillation start control signal (start), an oscillation detector (6) connected between an input or an output (coilp) of the reference oscillator (4) and the bias current generator (7) for controlling the generator (7) when an RF signal is received by the receiver, and an impedance matching unit (3) disposed between a receiving terminal or pad (2) of the receiver (1) and the reference oscillator (4), wherein, following the activation of an oscillation start control signal (start), a linear growth of the bias current value occurs until a critical bias current value is attained, the method comprises the step of detecting the oscillation of the reference oscillator (4), and once the reference oscillator oscillates above a critical increasing bias current value, the oscillation detector (6) orders the bias current generator (7) to immediately cut off the bias current (i_vco) of the reference oscillator (4) and thus stop the oscillation of the reference oscillator (4), in order to reduce the overall electricity consumption during an RF signal detection phase.

2. The method for detecting an RF signal according to claim 1, wherein the bias current (i_vco) is supplied to the reference oscillator (4) particularly after receiving each start control signal (start) over the time of a cycle of control signals (Sosc) for the bias current generator (7).

3. The method for detecting an RF signal according to claim 2, wherein the start control signal (start) starts over a period of 1 µs and that over one second, close to 1000 start control periods (start) of a cycle of successive control signals (Sosc) can be counted such that the receiver (1) is only fully engaged for 1 ms out of one second.

4. The method for detecting an RF signal according to claim 1, for which the receiver (1) further comprises a PLL phase lock loop (5), wherein over time, a tuning voltage (Vtune) is supplied to the reference oscillator, which is a VCO oscillator (4) for tuning the oscillation frequency.

5. The method for detecting an RF signal according to claim 1, wherein on each activation or start signal (start) supplied to the bias current generator (7), a bias current increases until a critical current value is attained from which the oscillation of the reference oscillator (4) starts, and wherein the oscillation detector (6) detects at the input or output of the reference oscillator (4) said oscillation to supply a stop control signal (stop) to the bias current generator (7) so as to immediately cut off the supply of a bias current to the reference oscillator (4) to stop it immediately and thus reduce the electricity consumption of the receiver.

6. A super-regenerative receiver (1) for implementing the method for detecting an RF signal according to claim 1 for which the receiver comprises a reference oscillator (4) for generating an oscillation in the oscillator, a bias current generator (7) for the reference oscillator (4) for supplying a bias current (i_vco) on receiving an oscillation start control signal (start), an oscillation detector (6) connected between an input or an output (coilp) of the reference oscillator (4) and the bias current generator (7) for controlling the generator (7) when an RF signal is received by the receiver, and an impedance matching unit (3) disposed between a receiving terminal or pad (2) of the receiver (1) and the reference oscillator (4), wherein following an activation of an oscillation start control signal (start), the receiver is intended to control the bias current generator (7) for the supply of the bias current with a linear growth of the bias current value until a critical bias current value is attained, said oscillation detector (6) being intended to detect an oscillation of the reference oscillator and once the reference oscillator oscillates above a critical increasing bias current value, supply a control signal to the bias current generator to immediate cut off the bias current of the reference oscillator (4) and thus stop the oscillation of the reference oscillator to reduce the electricity consumption.

7. The super-regenerative receiver (1) according to claim 6, wherein the receiving also comprises a PLL phase lock loop (5) for supplying a tuning voltage (Vtune) to the reference oscillator which is a VCO oscillator (4).

8. The super-regenerative receiver (1) according to claim 6 wherein the reference oscillator (4) operates at a frequency equal to or greater than 2.4 GHz and without lowering frequencies for demodulation operations.

* * * * *